(12) United States Patent
Shea

(10) Patent No.: US 7,276,455 B2
(45) Date of Patent: *Oct. 2, 2007

(54) METHODS OF ETCHING AN ALUMINUM OXIDE COMPRISING SUBSTRATE, AND METHODS OF FORMING A CAPACITOR

(75) Inventor: Kevin R. Shea, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/476,391

(22) Filed: Jun. 27, 2006

(65) Prior Publication Data

US 2006/0283837 A1 Dec. 21, 2006

Related U.S. Application Data

(63) Continuation of application No. 10/894,782, filed on Jul. 19, 2004, now Pat. No. 7,115,527.

(51) Int. Cl.
*H01L 21/461* (2006.01)
*H01L 21/302* (2006.01)

(52) U.S. Cl. .................. 438/745; 438/754
(58) Field of Classification Search ............ None
See application file for complete search history.

(56) References Cited

U.S. PATENT DOCUMENTS

| 5,858,255 A | 1/1999 | Kohara et al. |
| 5,885,888 A | 3/1999 | Konuma et al. |
| 7,115,527 B2 * | 10/2006 | Shea .................. 438/745 |
| 2003/0109106 A1 | 6/2003 | Pacheco Rotondaro et al. |
| 2003/0169629 A1 | 9/2003 | Goebel et al. |

* cited by examiner

*Primary Examiner*—Duy-Vu N Deo
(74) *Attorney, Agent, or Firm*—Wells St. John P.S.

(57) ABSTRACT

This invention methods of etching an aluminum oxide comprising substrate, and methods of forming capacitors. In one implementation, a method of etching an aluminum oxide comprising substrate includes flowing water and ozone to aluminum oxide on the substrate, with at least one of the water and the ozone being at a temperature of at least 65° C. at the aluminum oxide effective to etch aluminum oxide from the substrate. In one implementation, aspects of the method are utilized in forming a capacitor.

26 Claims, 5 Drawing Sheets

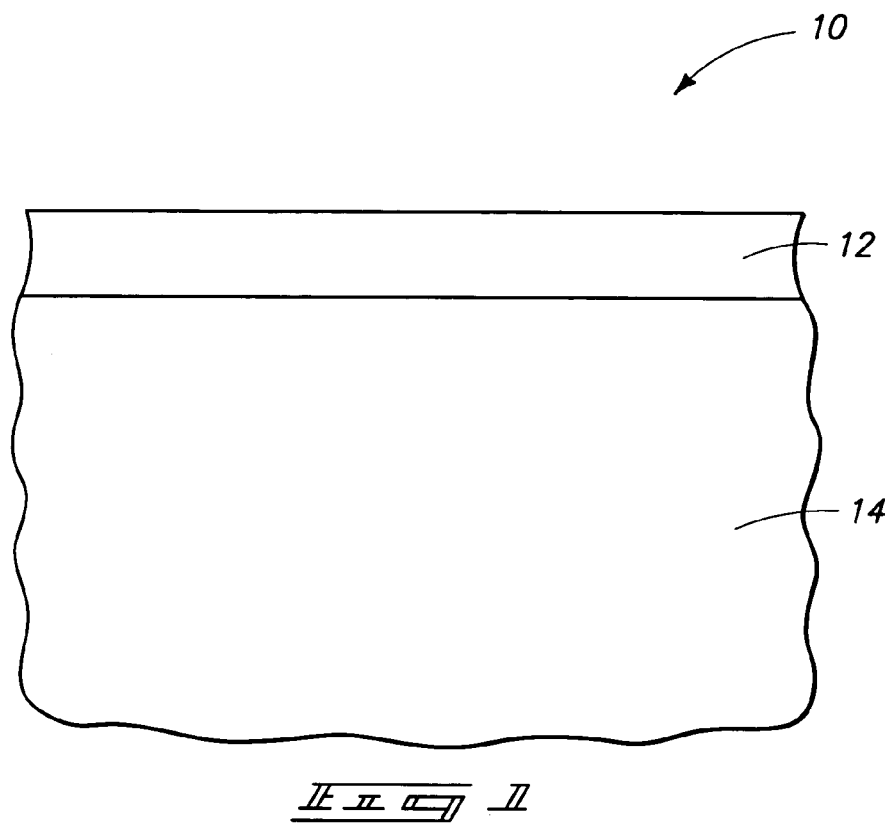
_FIG. 1_
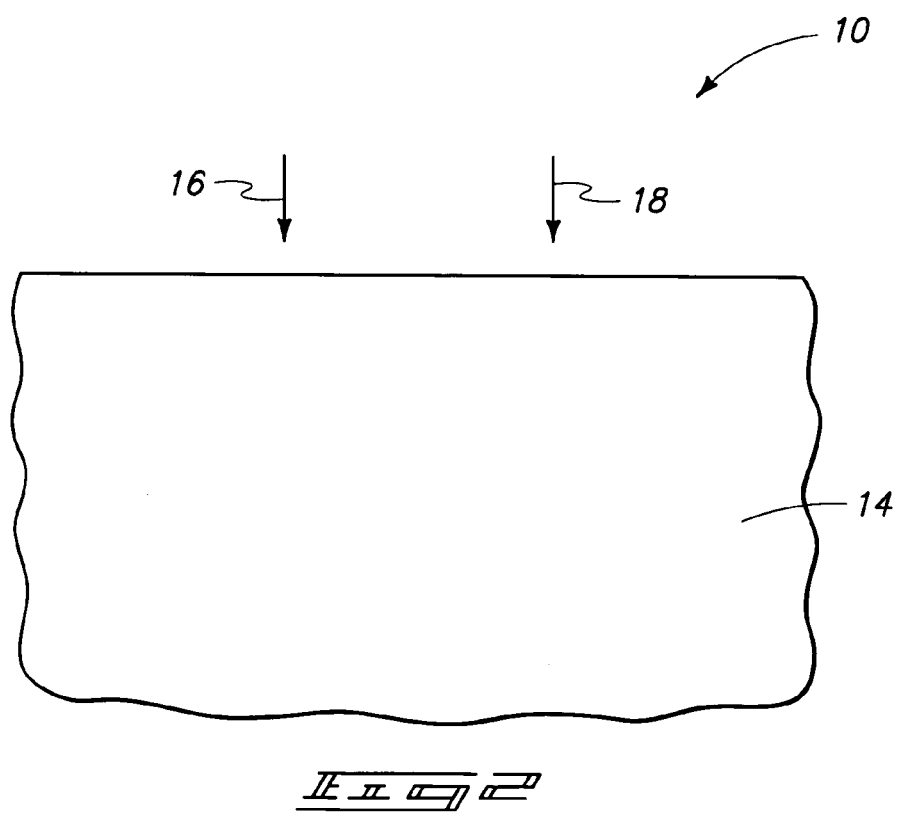
_FIG. 2_

US 7,276,455 B2

METHODS OF ETCHING AN ALUMINUM OXIDE COMPRISING SUBSTRATE, AND METHODS OF FORMING A CAPACITOR

RELATED PATENT DATA

This patent resulted from a continuation application of U.S. patent application Ser. No. 10/894,782, filed Jul. 19, 2004, entitled "Methods Of Etching An Aluminum Oxide Comprising Substrate, And Methods Of Forming A Capacitor", naming Kevin R. Shea as inventor, the disclosure of which is incorporated by reference.

TECHNICAL FIELD

This invention relates to methods of etching an aluminum oxide comprising substrate, and to methods of forming capacitors.

BACKGROUND OF THE INVENTION

One example chemistry for etching aluminum oxide is a base-buffered HF solution (for example 100 volume parts water to 1 volume part HF to 15 volume parts of a base) to provide the primary $H_2F_2$ etching species. This exemplary chemistry provides very good selectivity in etching aluminum oxides relative to titanium nitride, for example a selectivity of about 500:1. In the context of this document, selectivity in an etch for etching one material selectively to another requires removal/etching of the one relative to the other at a ratio of at least 2:1. Of course, often much higher selectivities are obtainable and desirable. The above exemplary chemistry has not produced desired degree of selectivity in etching aluminum oxide selectively relative to hafnium nitride and aluminum nitride. For example, using the above chemistry not only etches aluminum oxide but also etches aluminum nitride and hafnium nitride just as fast or faster.

One example chemistry for etching aluminum oxide is a base-buffered HF solution (for example 100 volume parts water to 1 volume part HF to 15 volume parts of a base) to provide the primary $H_2F_2$ etching species. This exemplary chemistry provides very good selectivity in etching aluminum oxides relative to titanium nitride, for example a selectivity of about 500:1. In the context of this document, selectivity in an etch for etching one material selectively to another requires removal/etching of the one relative to the other at a ratio of at least 2:1. Of course, often much higher selectivities are obtainable and desirable. The above exemplary chemistry has not produced desired degree of selectivity in etching aluminum oxide selectively relative to hafnium nitride and aluminum nitride. For example, using the above chemistry not only etches aluminum oxide but also etches aluminum nitride and hafnium nitride just as fast or faster.

While the invention was motivated in addressing the above identified issues, it is in no way so limited. Rather, the invention is only limited by the accompanying claims as literally worded without interpretative or other limiting reference to the specification, and in accordance with the doctrine of equivalents.

SUMMARY

This invention includes methods of etching an aluminum oxide comprising substrate, and methods of forming capacitors. In one implementation, a method of etching an aluminum oxide comprising substrate includes flowing water and ozone to aluminum oxide on the substrate, with at least one of the water and the ozone being at a temperature of at least 65° C. at the aluminum oxide effective to etch aluminum oxide from the substrate.

In one implementation, a method of forming a capacitor includes providing an aluminum oxide comprising layer laterally proximate a first capacitor electrode over a substrate. The first capacitor electrode comprises at least one of polysilicon, titanium nitride, hafnium nitride, and aluminum nitride. Water and ozone are flowed to the substrate, with the water and ozone being at a temperature of at least 65° C. at the substrate effective to etch aluminum oxide from the substrate selectively relative to the at least one of polysilicon, titanium nitride, hafnium nitride, and aluminum nitride and effective to expose an outer lateral sidewall of the first capacitor electrode. A capacitor dielectric layer is formed over the first capacitor electrode including its exposed outer lateral sidewall. A second capacitor electrode is formed over the capacitor dielectric layer.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a substrate fragment in process in accordance with an aspect of the invention.

FIG. 2 is a view of the FIG. 1 substrate fragment at a processing step subsequent to that depicted by FIG. 1.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
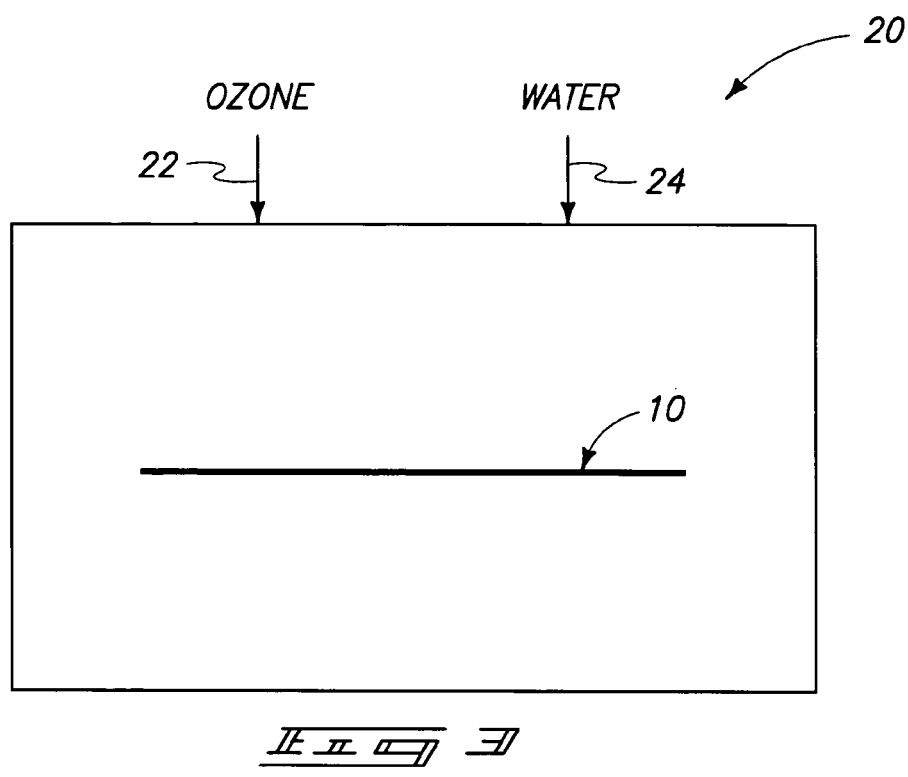
FIG. 3 is a diagrammatic view of a chamber within which the substrate of FIG. 1 can be processed in accordance with an aspect of the invention.

Exemplary preferred methods of etching an aluminum oxide comprising substrate are described initially with reference to FIGS. 1-3. FIG. 1 depicts a substrate fragment 10. Such comprises aluminum oxide thereon, for example an aluminum oxide comprising layer 12 received over some other material 14. Layer 12 might comprise, consist essentially of, or consist of aluminum oxide. In the depicted preferred embodiment, layer 12 is outwardly exposed, although such might be covered with one or more other materials or layers, either blanketedly or partially. In one exemplary preferred embodiment, material 14 comprises at least one of doped silicon dioxide, undoped silicon dioxide, titanium nitride, hafnium nitride, aluminum nitride, and polysilicon. In one preferred embodiment, the described method of etching aluminum oxide from substrate 10 will be conducted selectively relative to the at least one of doped silicon dioxide, undoped silicon dioxide, titanium nitride, hafnium nitride, aluminum nitride, and polysilicon.

Referring to FIG. 2, water and ozone have been flowed to the aluminum oxide (not shown in FIG. 2) on substrate 10, with at least one of the water and the ozone being at a temperature of at least 65° C. at the aluminum oxide effective to etch aluminum oxide from the substrate. By way of example only, an arrow 16 diagrammatically indicates the flow of ozone to what was aluminum oxide layer 12, and arrow 18 depicts the flowing of water (preferably deionized water) to what was aluminum oxide layer 12. Such streams might, of course, be flowed separately to the substrate, as indicated, or as a mixture wherein both the water and ozone will be at a temperature of at 65° C. at the aluminum oxide to effect the etch thereof.

Preferably, the water and the ozone are at temperatures no greater than 100° C. at the aluminum oxide. Further preferably, at least one of the water and the ozone is at a temperature of at least 85° C., and more preferably at a temperature of at least 90° C., at the aluminum oxide. Either of the water or the ozone might be at a temperature of at least 65° C. at the aluminum oxide during the etching, again with most preferably both such components being at a temperature of at least 65° C. For example and by way of example only in one preferred embodiment, both the water and the ozone are preferably at temperatures of from 80° C. to 100° C. at the aluminum oxide. Further in one preferred embodiment, the etching is preferably void of any fluorine at the aluminum oxide during the etching. An exemplary etching rate is from 200 Angstroms per minute to 500 Angstroms per minute.

In one exemplary preferred embodiment, the etching is conducted within a chamber. For example, FIG. 3 diagrammatically depicts a chamber 20 within which substrate 10 has been provided. Arrow 22 diagrammatically depicts an ozone comprising feed stream to chamber 20, with arrow 24 diagrammatically depicting a water comprising feed stream to chamber 20. In one preferred embodiment, ozone is present in stream 22 at greater than or equal to 190 mg/liter, more preferably at greater than or equal to 200 mg/liter, even more preferably at greater than or equal to 230 mg/liter. By way of example only, stream 22 comprises gases in addition to ozone, with ozone preferably being present in stream 22 at from 190 mg/liter to 280 mg/liter. In one preferred embodiment, stream 22 comprises $O_2$, for example resulting from feeding $O_2$ to an ozonator whereby an $O_2/O_3$ stream from the ozonator is fed to chamber 20. Stream 22 might also comprise other gases, for example $N_2$, although such is not necessarily preferred. In one exemplary embodiment, any $N_2$ present in stream 22 is at less than 100 ppm, more preferably at less than 20 ppm.

In one preferred embodiment, ozone comprising stream 22 is fed to the chamber at a temperature below 40° C., more preferably below 30° C., and for example at about ambient room temperature as, for example, exiting from an ozonator. Further in one preferred embodiment, water stream 24 is fed to chamber 20 at some temperature above 65° C., with the water heating the ozone within chamber 20 to be at a temperature of at least 65° C. at the aluminum oxide. Higher temperatures for water stream 24 are more preferred, for example temperatures of at least 80° C., more preferably at least 85° C., and even more preferably at temperatures of at least 90° C. Stream 22 might also, of course, be heated to desired higher temperatures, including at or above the temperature at which stream 24 is emitted into chamber 20.

The invention was reduced-to-practice in a Scepter™ atmospheric spray acid tool available from Semitool, Inc. of Kalispell, Mont. Feed stream 24 consisted essentially of deionized water at 95° C. fed at 5 liters/minute. Such a tool contained a plurality of substrates 10 for etching. Ozone comprising feed stream 22 resulted from feeding 10 standard liters per minute of $O_2$ having about 10 ppm of $N_2$ (at 40 to 70 PSI partial pressure) to an ozonator. Such stream 22 was at about ambient room temperature as fed to chamber 20, and had an ozone concentration of about 234 mg/liter. The $O_2/O_3$ stream fed to the chamber is believed to essentially diffuse through the de-ionized water, with the de-ionized water both heating the primary etch-effective ozone and clearing away the etchant reaction product from the substrates.

FIG. 2 depicts, in one preferred embodiment, the water and ozone flowing being effective to etch aluminum oxide from the substrate whereby material 14 is exposed during at least some of the etch, and with the etch removing aluminum oxide of layer 12 selectively relative to the at least one of doped silicon dioxide, updoped silicon dioxide, titanium nitride, hafnium nitride, aluminum nitride, and polysilicon of material 14. In one preferred embodiment, the selectivity is at least 10:1, and more preferably at least 100:1. Material 14 might, of course, comprise any one or combination of the stated silicon dioxide, titanium nitride, hafnium nitride, aluminum nitride, and polysilicon in layers, homogenously, or otherwise. In one exemplary preferred embodiment, material 14 comprises at least two of doped silicon dioxide, updoped silicon dioxide, titanium nitride, hafnium nitride, aluminum nitride, and polysilicon. Further in one preferred embodiment, material 14 comprises silicon dioxide and at least one of hafnium nitride and aluminum nitride.

Figure 4:
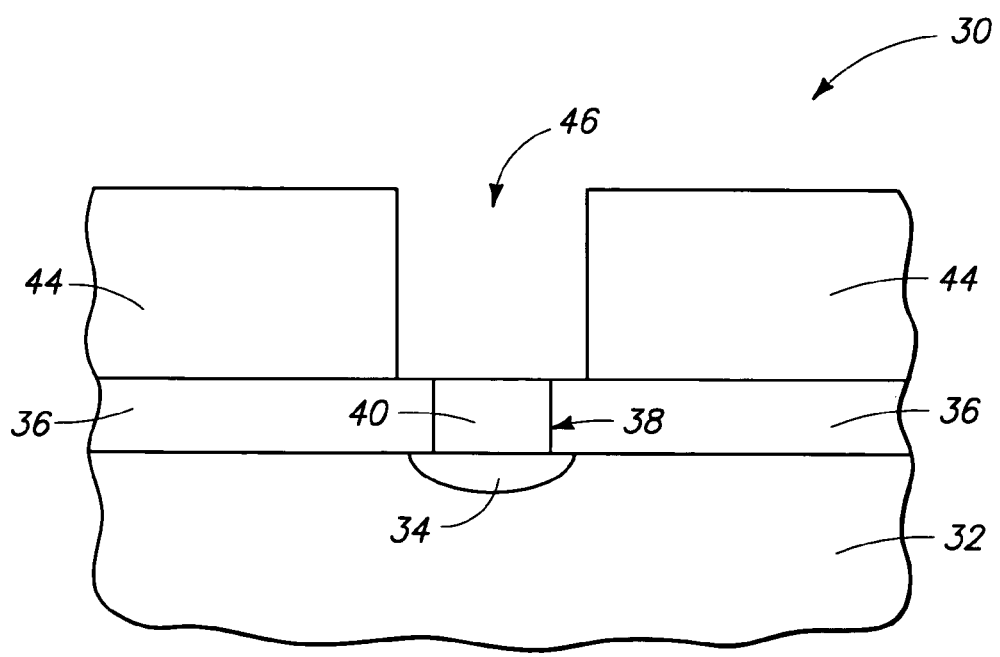
FIG. 4 is a diagrammatic sectional view of another substrate fragment in process in accordance with an aspect of the invention.
Figure 5:
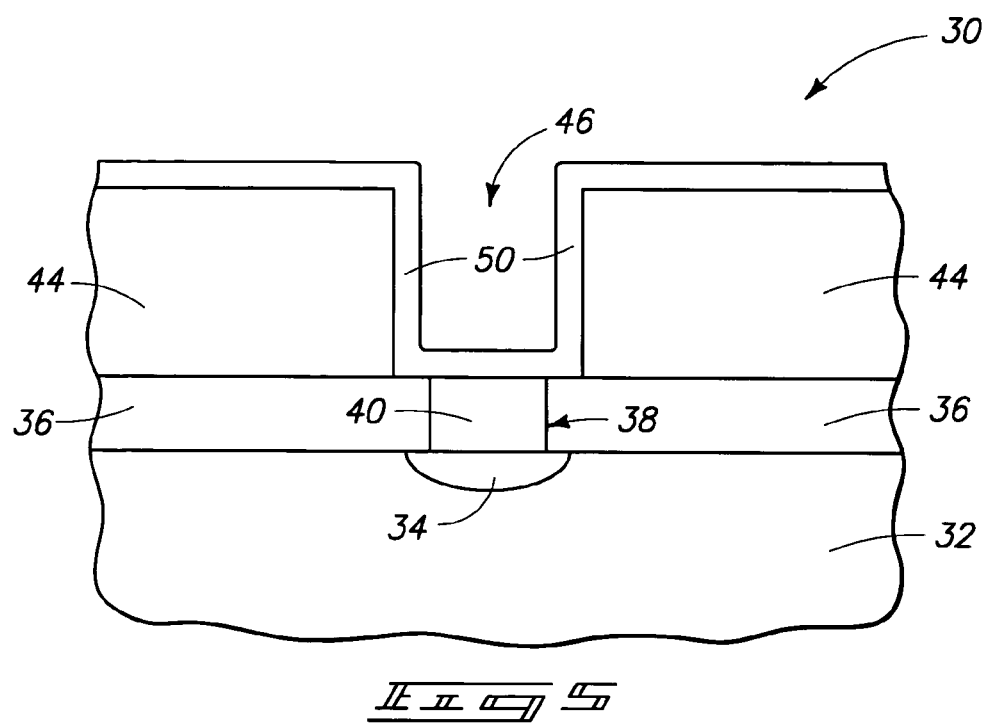
FIG. 5 is a view of the FIG. 4 substrate fragment at a processing step subsequent to that depicted by FIG. 4.
Figure 6:
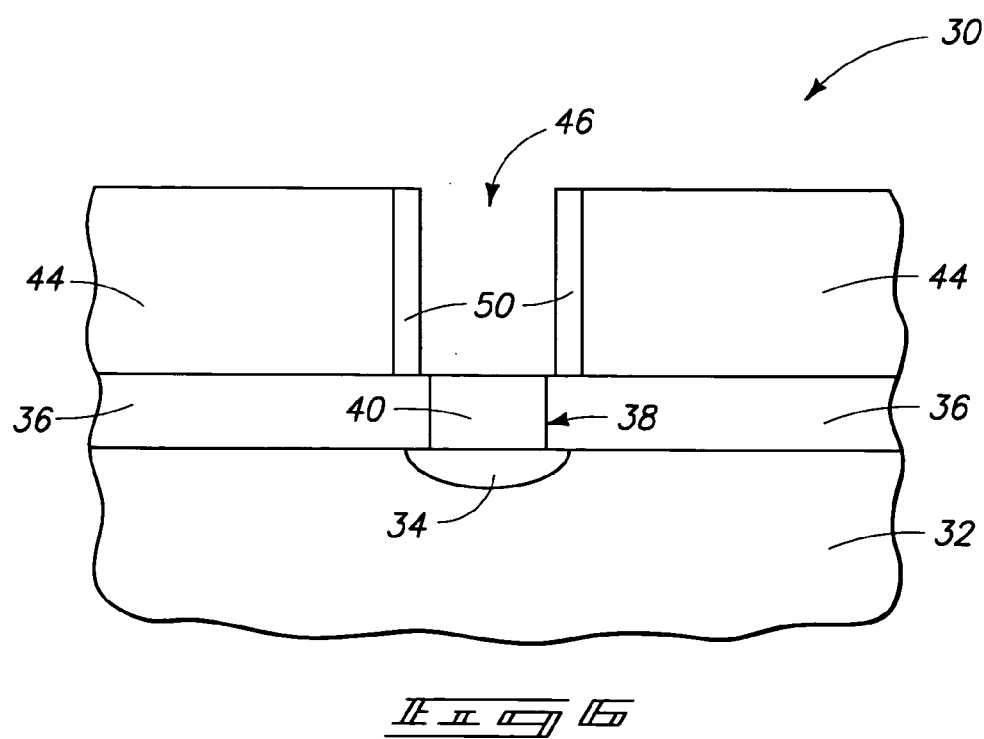
FIG. 6 is a view of the FIG. 5 substrate fragment at a processing step subsequent to that depicted by FIG. 5.

By way of example only, the invention also contemplates a method of forming a capacitor, for example and by way of example only, as depicted and described with reference to FIGS. 4-8. FIG. 4 depicts a substrate fragment 30 comprising a bulk semiconductive material 32. Of course, semiconductor-on-insulator substrates are also contemplated, including any other substrate whether existing or yet-to-be developed. By way of example only, an exemplary material for substrate 32 is doped bulk monocrystalline silicon. A conductively doped diffusion region 34 is received within bulk substrate 32.

A dielectric layer 36 has been formed over bulk substrate 32, and an opening 38 formed therein to diffusion region 34. An exemplary material for layer 36 is silicon nitride and/or silicon dioxide. Opening 38 is filled with conductive material, for example one or a combination of metals, metal compounds and/or conductively doped semiconductive materials. A silicon dioxide comprising layer 44 has been formed over substrate 32/36/40. An exemplary preferred material is doped silicon dioxide, such as borophosphosilicate glass (BPSG). An opening 46 has been formed within silicon dioxide comprising layer 44. By way of example only, exemplary techniques include photolithographic patterning and etch.

Figure 7:
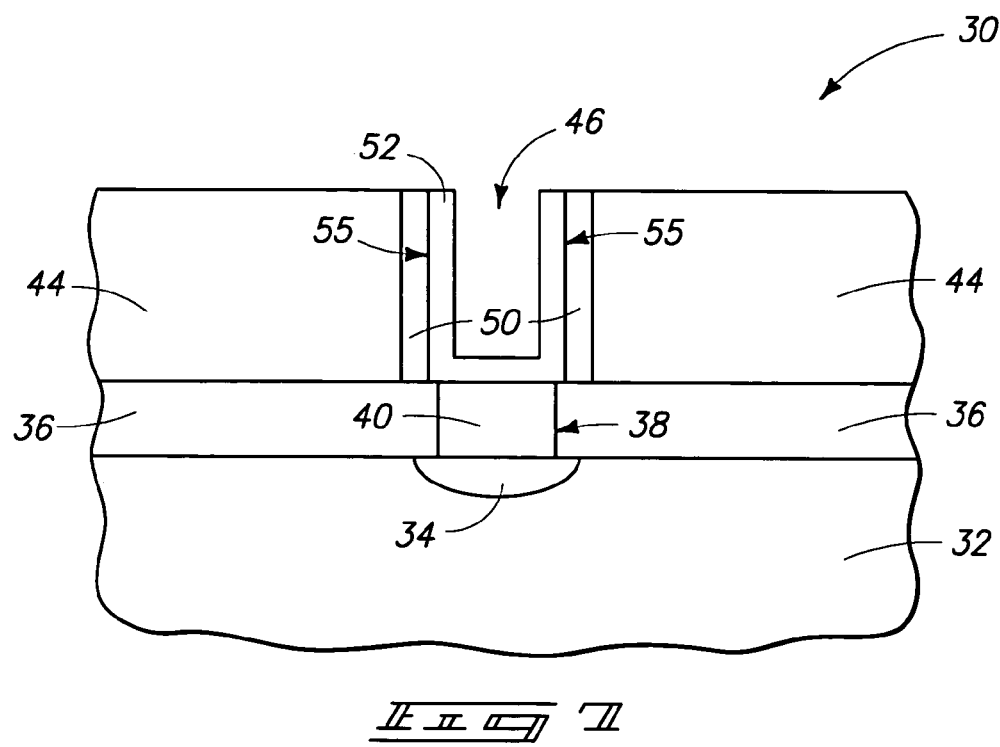
FIG. 7 is a view of the FIG. 6 substrate fragment at a processing step subsequent to that depicted by FIG. 6.

Referring to FIG. 7, a first capacitor electrode 52 has been formed within opening 46, with aluminum oxide comprising layer 50 being received laterally intermediate first capacitor electrode 52 and silicon dioxide comprising layer 44 within which opening 46 is formed. First capacitor electrode 52 comprises at least one of polysilicon, titanium nitride, hafnium nitride, and aluminum nitride. By way of example only, such might be deposited by chemical vapor deposition followed by planarize polishing, for example chemical mechanical polishing, relative to material 44 for example to form the depicted isolated first capacitor electrode 52. In the depicted exemplary preferred embodiment, aluminum oxide comprising layer 50 contacts first capacitor electrode 52, and first capacitor electrode 52 can be considered as comprising an outer lateral sidewall 55.

The above-described processing relative to FIGS. 4-7 describes and depicts but one exemplary manner of providing an aluminum oxide comprising layer laterally proximate a first capacitor electrode over a substrate where the first capacitor electrode comprises at least one of polysilicon, titanium nitride, hafnium nitride, and aluminum nitride. Any other methods and structures are of course contemplated.

Figure 8:
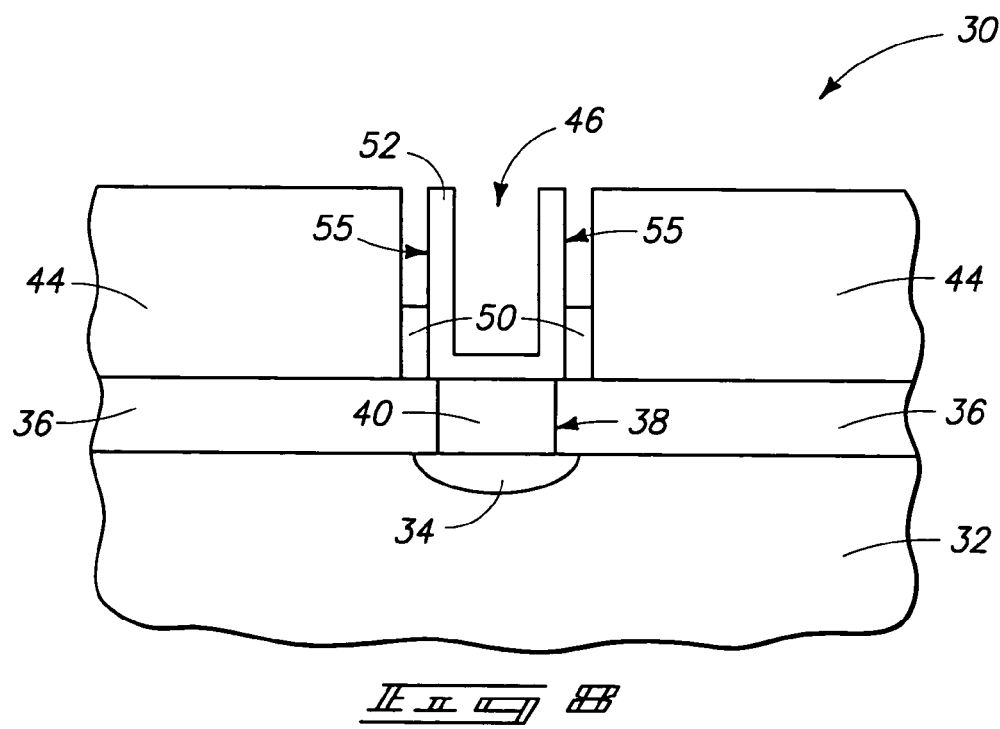
FIG. 8 is a view of the FIG. 7 substrate fragment at a processing step subsequent to that depicted by FIG. 7.

Referring to FIG. 8, water and ozone have been flowed to substrate 30. The water and ozone are preferably at a temperature of at least 65° C. at the substrate effective to etch aluminum oxide 50 from substrate 30 selectively relative to silicon dioxide 44 and the at least one of polysilicon, titanium nitride, hafnium nitride, and aluminum nitride of first capacitor electrode 52 effective to expose an outer lateral sidewall 55 of first capacitor electrode 52. Of course, all of the above preferred attributes of an aluminum oxide etch apply in accordance with the first described embodiments with reference to etching material 50 in the FIGS. 4-8 embodiment. Such etching can be a timed etch to expose any desired quantity of outer lateral sidewall 55.

Figure 9:
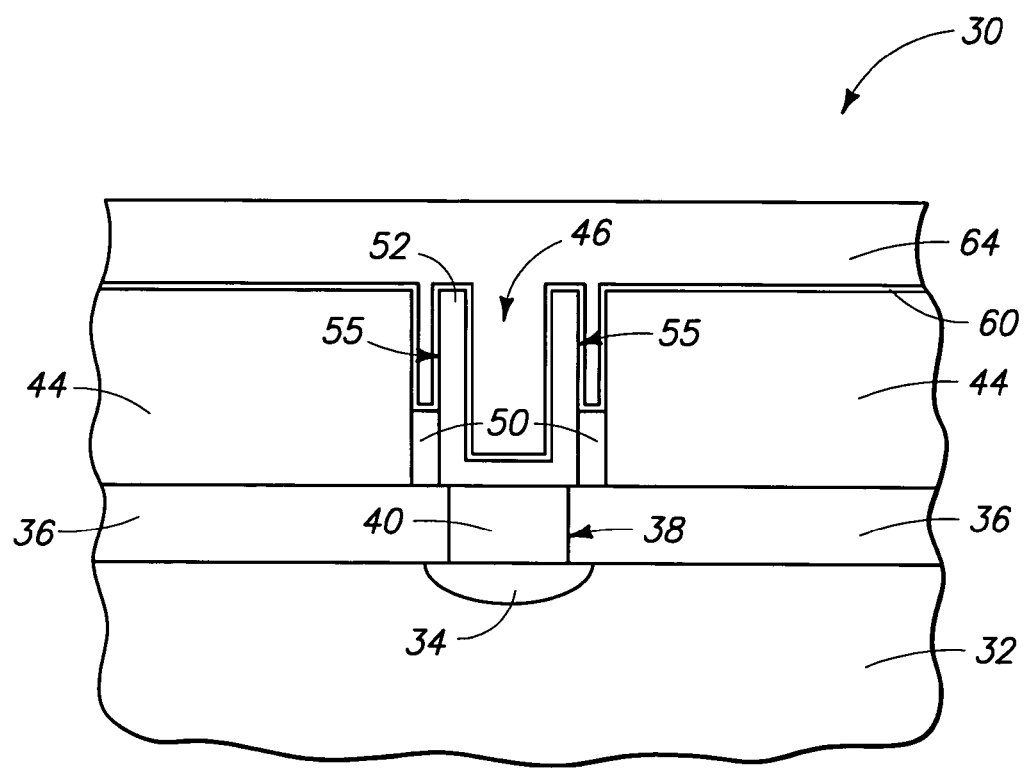
FIG. 9 is a view of the FIG. 8 substrate fragment at a processing step subsequent to that depicted by FIG. 8.

Referring to FIG. 9, a capacitor dielectric layer 60 is formed over first capacitor electrode 52 including its exposed outer lateral sidewall 55. Exemplary preferred materials include silicon nitride and high k layers such as tantalum pentoxide, aluminum oxide, barium strontium titanate, etc. A second capacitor electrode 64 is formed over capacitor dielectric layer 60, with any suitable conductive material being contemplated.

Referring to FIG. 9, a capacitor dielectric layer 60 is formed over first capacitor electrod 52 including its exposed outer lateral sidewall 22. Exemplary preferred materials include silicon nitride and high k layers such as tantalum pentoxide, aluminum oxide, barium strontium titanate, etc. A second capacitor electrode 64 is formed over capacitor dielectric layer 60, with any suitable conductive material being contemplated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of etching an aluminum oxide-comprising substrate, comprising:
   providing an aluminum oxide-comprising substrate within a chamber; and
   flowing water and ozone to aluminum oxide on the substrate within the chamber, the water and the ozone being at a temperature of at least 65° C. at the aluminum oxide effective to etch aluminum oxide from the substrate, the ozone being fed to the chamber in a stream, ozone being present in the stream at greater than or equal to 190 mg/titer, the stream being at a temperature below 40° C. where fed to the chamber, the water being fed to the chamber at a temperature above 65° C., the ozone being heated within the chamber to a temperature of at least 65° at the aluminum oxide.

2. The method of claim 1 wherein the water and the ozone are at a temperature of at least 85° C. at the aluminum oxide, the water being fed to the chamber at a temperature above 85° C., the ozone being at a temperature of at least 85° at the aluminum oxide.

3. The method of claim 1 wherein the water and the ozone are at a temperature of at least 90° at the aluminum oxide, the water being fed to the chamber at a temperature above 90° C., the ozone being at a temperature of at least 90° at the aluminum oxide.

4. The method of claim 1 wherein the stream is at about ambient room temperature where fed to the chamber.

5. The method of claim 1 wherein the stream comprises $O_2$.

6. The method of claim 1 wherein the stream comprises $N_2$.

7. The method of claim 1 wherein ozone is present in the stream at greater than or equal to 200 mg/liter.

8. The method of claim 1 wherein ozone is present in the stream at greater than or equal to 230 mg/liter.

9. A method of etching an aluminum oxide-comprising substrate, comprising:
   providing an aluminum oxide-comprising substrate within a chamber; and
   flowing water and ozone to aluminum oxide on the substrate within the chamber, the water and the ozone being at a temperature from 85° C. to 100° C. at the aluminum oxide effective to etch aluminum oxide from the substrate, the ozone being fed to the chamber in a stream, the stream comprising $O_2$, ozone being present in the stream at from 190 mg/lIter to 280 mg/liter, the stream being at a temperature below 40° C. where fed to the chamber, the water being fed to the chamber at a temperature from 85° C. to 100° C. the ozone being heated within the chamber to a temperature of at least 85° at the aluminum oxide.

10. The method of claim 9 wherein the stream is at about ambient room temperature where fed to the chamber.

11. The method of claim 9 wherein the stream comprises $N_2$.

12. The method of claim 11 wherein $N_2$ is present in the stream at less than 100 ppm.

13. The method of claim 11 wherein $N_2$ is present in the stream at less than 20 ppm.

14. The method of claim 9 wherein ozone is present in the stream at greater than or equal to 230 mg/liter.

15. A method of forming a capacitor, comprising:
   providing an aluminum oxide-comprising layer laterally proximate a first capacitor electrode over a substrate, the first capacitor electrode comprising at least one of polysilicon, titanium nitride, hafnium nitride, and aluminum nitride;
   providing the substrate within a chamber;
   flowing water and ozone to the substrate within the chamber, the water and ozone being at a temperature of at least 65° C. at the substrate effective to etch aluminum oxide from the substrate selectively relative to the at least one of polysilicon, titanium nitride, hafnium nitride, and aluminum nitride and effective to expose an outer lateral sidewall of the first capacitor electrode, the ozone being fed to the chamber in a stream, the stream being at a temperature below 40° C. where fed to the chamber, the water being fed to the chamber at a temperature above 65° C., the ozone being heated within the chamber to a temperature of at least 65° at the aluminum oxide;

forming a capacitor dielectric layer over the first capacitor electrode including its exposed outer lateral sidewall; and forming a second capacitor electrode over the capacitor dielectric layer.

16. The method of claim 15 wherein the aluminum oxide-comprising layer contacts the first capacitor electrode.

17. The method of claim 15 wherein the ozone and the water are at temperatures of from 80° C. to 100° C. at the aluminum oxide.

18. The method of claim 15 wherein the ozone and the water are at temperatures of from 90° C. to 100° C. at the aluminum oxide.

19. The method of claim 15 wherein the ozone is fed to the chamber in a stream, ozone being present in the stream at greater than or equal to 190 mg/liter.

20. The method of claim 15 wherein,
the ozone is fed to the chamber in a stream, ozone being present in the stream at greater than or equal to 190 mg/liter; and
the ozone and the water are at temperatures of from 90° C. to 100° C. at the aluminum oxide.

21. A method of forming a capacitor, comprising:
forming a silicon dioxide comprising layer over a substrate;
forming an opening within the silicon dioxide comprising layer;
forming an aluminum oxide comprising layer within the opening;
forming a first capacitor electrode comprising at least one of polysilicon, titanium nitride, hafnium nitride, and aluminum nitride within the opening, the aluminum oxide comprising layer being received laterally intermediate the first capacitor electrode and the silicon dioxide comprising layer within which the opening is formed;
providing the substrate within a chamber;
flowing water and ozone to the substrate within the chamber, the water and ozone being at a temperature of at least 65° C. at the substrate effective to etch aluminum oxide from the substrate selectively relative to the silicon dioxide and the at least one of polysilicon, titanium nitride, hafnium nitride, and aluminum nitride and effective to expose an outer lateral sidewall of the first capacitor electrode, the ozone being fed to the chamber in a stream, the stream being at a temperature below 40° C. where fed to the chamber, the water being fed to the chamber at a temperature above 65° C., the ozone being heated within the chamber to a temperature of at least 65° at the aluminum oxide;
forming a capacitor dielectric layer over the first capacitor electrode including its exposed outer lateral sidewall; and
forming a second capacitor electrode over the capacitor dielectric layer.

22. The method of claim 21 wherein the aluminum oxide-comprising layer contacts the first capacitor electrode.

23. The method of claim 21 wherein the ozone and the water are at temperatures of from 80° C. to 100° C. at the aluminum oxide.

24. The method of claim 21 wherein the ozone and the water are at temperatures of from 90° C. to 100° C. at the aluminum oxide.

25. The method of claim 21 wherein the ozone is fed to the chamber in a stream, ozone being present in the stream at greater than or equal to 190 mg/liter.

26. The method of claim 21 wherein,
the ozone is fed to the chamber in a stream, ozone being present in the stream at greater than or equal to 190 mg/liter; and
the ozone and the water are at temperatures of from 90° C. to 100° C. at the aluminum oxide.

* * * * *

UNITED STATES PATENT AND TRADEMARK OFFICE
CERTIFICATE OF CORRECTION

PATENT NO. : 7,276,455 B2 Page 1 of 1
APPLICATION NO. : 11/476391
DATED : October 2, 2007
INVENTOR(S) : Shea It is certified that error appears in the above-identified patent and that said Letters Patent is hereby corrected as shown below:

In column 5, line 66, in Claim 1, delete "190 mg/titer" and insert -- 190 mg/liter --, therefor.

In column 6, line 3, in Claim 1, delete "65°" and insert -- 65° C. --, therefor.

In column 6, line 7, in Claim 2, delete "85°" and insert -- 85° C. --, therefor.

In column 6, line 10, in Claim 3, delete "90°" and insert -- 90° C. --, therefor.

In column 6, line 12, in Claim 3, delete "90°" and insert -- 90° C. --, therefor.

In column 6, line 35, in Claim 9, delete "190 mg/lIter" and insert -- 190 mg/liter --, therefor.

In column 6, line 38, in Claim 9, after "100° C." insert -- , --.

In column 6, line 39, in Claim 9, delete "85°" and insert -- 85° C. --, therefor.

In column 7, line 2, in Claim 15, delete "65°" and insert -- 65° C. --, therefor.

In column 7, line 10, in Claim 16, delete "oxide-comprislng" and insert -- oxide-comprising --, therefor.

In column 7, line 14, in Claim 18, delete "claIm 15" and insert -- claim 15 --, therefor.

In column 8, line 14, in Claim 21, delete "65°" and insert -- 65°C. --, therefor.

Signed and Sealed this

Eleventh Day of December, 2007

JON W. DUDAS
*Director of the United States Patent and Trademark Office*